United States Patent
Chin et al.

(10) Patent No.: US 9,130,027 B2
(45) Date of Patent: Sep. 8, 2015

(54) HIGH ELECTRON MOBILITY BIPOLAR TRANSISTOR

(71) Applicant: VISUAL PHOTONICS EPITAXY CO., LTD., Taoyuan (TW)

(72) Inventors: Yu-Chung Chin, New Taipei (TW); Chao-Hsing Huang, Taipei (TW)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 0 days.

(21) Appl. No.: 14/326,673

(22) Filed: Jul. 9, 2014

(65) Prior Publication Data

US 2014/0361344 A1 Dec. 11, 2014

Related U.S. Application Data

(62) Division of application No. 13/910,241, filed on Jun. 5, 2013, now Pat. No. 8,994,069.

(51) Int. Cl.

| | |
|---|---|
| *H01L 21/02* | (2006.01) |
| *H01L 29/06* | (2006.01) |
| *H01L 29/20* | (2006.01) |
| *H01L 29/66* | (2006.01) |
| *H01L 29/778* | (2006.01) |
| *H01L 29/737* | (2006.01) |
| *H01L 29/08* | (2006.01) |
| *H01L 29/205* | (2006.01) |

(52) U.S. Cl.
CPC .......... *H01L 29/778* (2013.01); *H01L 29/0821* (2013.01); *H01L 29/20* (2013.01); *H01L 29/2003* (2013.01); *H01L 29/205* (2013.01); *H01L 29/7371* (2013.01); *H01L 29/7378* (2013.01); *H01L 29/7785* (2013.01)

(58) Field of Classification Search
CPC ............ H01L 29/7378; H01L 29/7783; H01L 29/7371; H01L 29/7785; H01L 29/778; H01L 29/20; H01L 29/2003; H01L 29/205; H01L 29/0821
USPC ........................................... 257/89, 194, 190
See application file for complete search history.

(56) References Cited

U.S. PATENT DOCUMENTS

| | | | | |
|---|---|---|---|---|
| 5,250,826 | A * | 10/1993 | Chang et al. ................... | 257/273 |
| 6,906,359 | B2 * | 6/2005 | Zampardi et al. .............. | 257/197 |
| 2004/0135161 | A1* | 7/2004 | Taylor .............................. | 257/89 |
| 2005/0184310 | A1* | 8/2005 | Krutko et al. .................. | 257/197 |
| 2007/0090399 | A1* | 4/2007 | Chin et al. ..................... | 257/197 |

* cited by examiner

*Primary Examiner* — Ha Tran T Nguyen
*Assistant Examiner* — Dzung Tran
(74) *Attorney, Agent, or Firm* — Lin & Associates IP, Inc.

(57) ABSTRACT

A high electron mobility bipolar transistor including a substrate, a pseudomorphic high electron mobility transistor (pHEMT) sub structure, a sub collector/separating layer and a heterojunction bipolar transistor (HBT) sub structure sequentially stacked from bottom to top is disclosed. The sub collector/separating layer and the pHEMT sub structure are combined to form a pHEMT, and the sub collector/separating layer and the HBT sub structure are combined to form an HBT. The carbon concentration in the sub collector/separating layer is within $5\times10^{17}$ cm$^{-3}$ and $1\times10^{20}$ cm$^{-3}$, and/or the oxygen concentration within $5\times10^{18}$ cm$^{-3}$ and $1\times10^{20}$ cm$^{-3}$. The lattice during the process of epitaxy growth is stabilized and it is possible to prevent the dopants, the elements, the vacancies or the defects from diffusing into the neighboring layers, thereby improving the problem of mobility degradation and resistance increase, and sustaining the stability of the manufacturing process.

8 Claims, 2 Drawing Sheets

HIGH ELECTRON MOBILITY BIPOLAR TRANSISTOR

CROSS-REFERENCES TO RELATED APPLICATIONS

This is a division of U.S. patent application Ser. No. 13/910,241, filed Jun. 5, 2013, which is incorporated herewith by reference in its entirety.

BACKGROUND OF THE INVENTION

1. Field of the Invention

The present invention relates to a High Electron Mobility Bipolar Transistor (BiHEMT), and more specifically to a sub-collector/separating layer (i.e. the separating layer is an epi layer that vertically separates the heterojunction bipolar transistor and pseudomorphic high electron mobility transistor) with carbon concentration within $5\times10^{17}$ cm$^{-3}$ and $1\times10^{20}$ cm$^{-3}$, and/or the oxygen concentration within $5\times10^{18}$ cm$^{-3}$ and $1\times10^{20}$ cm$^{-3}$.

2. The Prior Arts

Compared with the Si based FET, heterojunction bipolar transistors (HBTs) with better capability of power handling and linearity are more suitable for the application of power devices, especially for the power amplifiers in the smart phones and tablet PCs. The pseudomorphic high electron mobility transistors (pHEMTs) that is the device with very high mobility are undoubtedly suitable for the high speed switches and low noise amplifiers (LNA). To take the advantages from both, the original concept of manufacturing the BiHEMT is based on silicon-based BiCMOS by integrating the HBT and pHEMT on a single epi stack. The integration HBT and pHEMT can reduce the size of the module from original two chips to one chip, the package cost, and increase the functionality.

However, one problem in the manufacturing of the BiHEMT in the prior arts is that the defects in the sub-collector and separating layer are diffusive during the epitaxial growth process, and thus cause the elements and dopants in the neighboring layers for example, the InGaP etch stop layer in the pHEMT, the AlGaAs Schottky layer and the Si doped AlGaAs donor layers) diffuse outward. This leads to channel mobility degradation and on-resistance increase in the pHEMT. Additionally, it makes process sensitive to the growth parameters such as growth temperature and difficult to control. Therefore, it is desired a new structure for the BiHEMT to solve the above issues.

SUMMARY OF THE INVENTION

The primary objective of the present invention is to provide a BiHEMT including a substrate, a pseudomorphic high electron mobility transistor (pHEMT) sub-structure, a sub-collector/separating layer and a heterojunction bipolar transistor (HBT) sub-structure, which are sequentially stacked from the bottom to top. The sub-collector/separating layer is used to combine with the pHEMT sub structure to form a pHEMT, and the sub-collector/separating layer and the HBT sub-structure are combined to form an HBT. The carbon concentration in the sub-collector/separating layer is within $5\times10^{17}$ cm$^{-3}$ and $1\times10^{20}$ cm$^{-3}$, and/or the oxygen concentration within $5\times10^{18}$ cm$^-$and $1\times10^{20}$ cm$^{-3}$.

The sub-collector/separating layer can be a single layer or a three-layer structure including a cap layer, a separating layer and a sub-collector layer. In case of the three-layer structure as the sub-collector/separating layer, the cap layer and the pHEMT sub structure are combined to form a pHEMT, and the sub-collector layer and the HBT sub structure are combined to form an HBT such that the pHEMT and the HBT are joined together by the separating layer. The carbon concentration in at least one of the cap layer, separating layer and sub-collector layer is within $5\times10^{17}$ cm$^{-3}$ and $1\times10^{20}$ cm$^{-3}$, and/or the oxygen concentration within $5\times10^{18}$ cm$^{-3}$ and $1\times10^{20}$ cm$^{-3}$.

One feature of the present invention is that at least the carbon concentration in the sub-collector/separating layer is within $5\times10^{17}$ cm$^{-3}$ and $1\times10^{20}$ cm$^{-3}$, and/or the oxygen concentration within $5\times10^{18}$ cm$^{-3}$ and $1\times10^{20}$ cm$^{-3}$.

Furthermore, the present invention can be applied to the Schottky layer and etch stop layer to stabilize the lattice during the epitaxial growth process. As a result, this can prevent the dopants, the elements, the vacancies or the defects from diffusing into neighboring layers during the epitaxial growth and thus the problem of mobility degradation and resistance increase can be solved and the run to run and wafer to wafer process stability can be achieved.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) depict only the preferred embodiments of the invention and shall not be considered as limitations to the scope of the present invention. Modifications of the shape of the present invention shall be considered within the spirit of the present invention.

Figure 1:
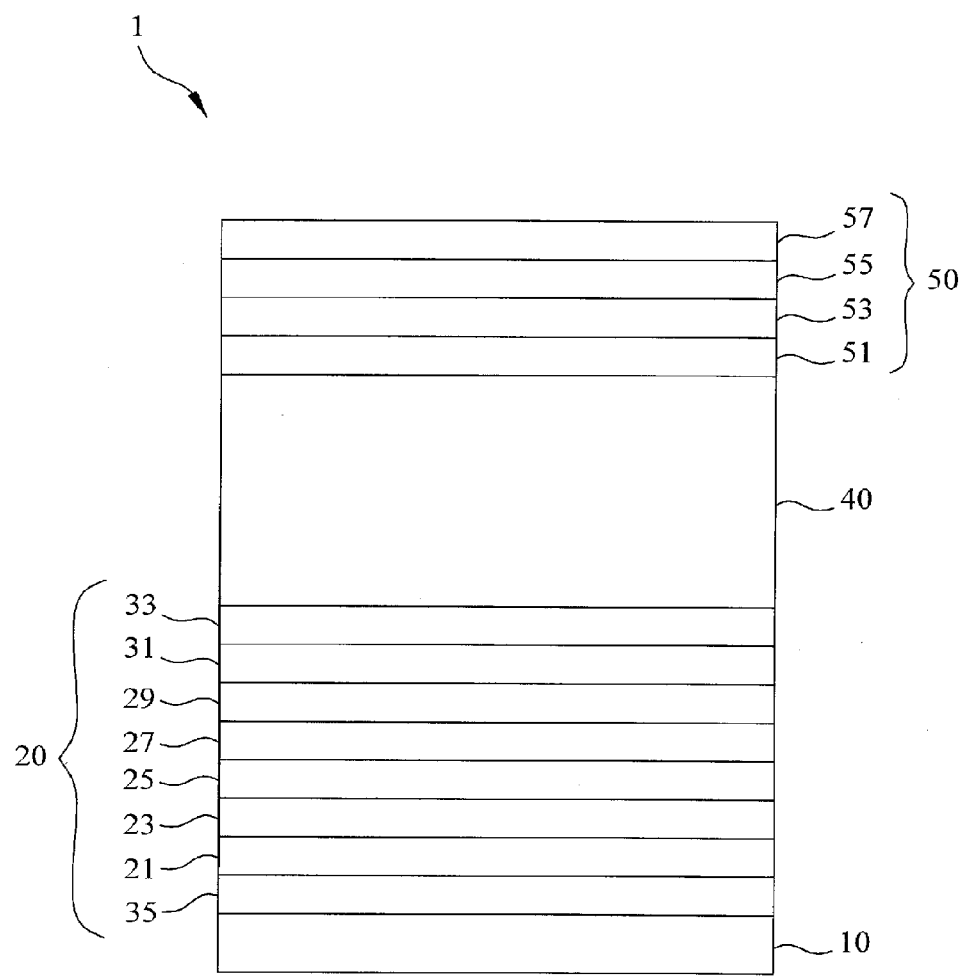
FIG. 1 schematically shows a structure of the BiHEMT according to one preferred embodiment of the present invention.

Please refer to FIG. 1, and as shown in FIG. 1, the BiHEMT of the present invention includes a substrate 10, a pseudomorphic high electron mobility transistor (pHEMT) sub structure 20, a sub-collector/separating layer 40 and a heterojunction bipolar transistor (HBT) sub structure 50, which are sequentially stacked from bottom to top. The sub-collector/separating layer 40 is used to combine with the pHEMT sub structure 20 to form a pHEMT, and the sub-collector/separating layer 40 and the HBT sub structure 50 are combined to form an HBT. At least, the carbon concentration in the sub-collector/separating layer 40 is within $5\times10^{17}$ cm$^{-3}$ and $1\times10^{20}$ cm$^{-3}$, and/or the oxygen concentration within $5\times10^{18}$ cm$^{-3}$ and $1\times10^{20}$ cm$^{-3}$.

The substrate 10 is formed with semi-insulating (SI) gallium arsenide (GaAs), and the pHEMT sub structure 20 includes a first donor layer 21, a first spacer layer 23, a channel layer 25, a second spacer layer 27, a second donor layer 29, a Schottky layer 31 and an etch top layer 33, which are sequentially stacked from bottom to top. The first donor layer 21 and the second donor layer 29 are formed with at least one of silicon-doped gallium arsenide (Si-doped GaAs), silicon-doped aluminum gallium arsenide (Si-doped $Al_xGa_{1-x}As$, $0 \leq x \leq 1$), silicon-doped Indium aluminum gallium phosphide (Si-doped $In_yAl_zGa_{1-y-z}P$, $0<y$, $z \leq 1$) and silicon-doped Indium gallium phosphide arsenide (Si-doped $In_wGa_{1-w}As_vP_{1-v}$, $0 \leq w$, $v \leq 1$). The doping level of silicon is within $1 \times 10^{13}$ cm$^{-3}$ and $1 \times 10^{19}$ cm$^{-3}$, and the thickness is about 0.5~100 nm.

Additionally, the first donor layer 21 and the second donor layer 29 can also be delta-doped by at least one of silicon-delta doped gallium arsenide (Si-delta doped GaAs), silicon-delta doped aluminum gallium arsenide (Si-delta doped $Al_xGa_{1-x}As$, $0<x \leq 1$), silicon-delta doped Indium aluminum gallium phosphide (Si-delta doped $In_yAl_zGa_{1-y-z}P$, $0<y$, $z \leq 1$) and silicon-delta doped Indium gallium phosphide arsenide (Si-delta doped $In_wGa_{1-w}As_vP_{1-v}$, $0 \leq w$, $v \leq 1$). The doping level of silicon is within $1 \times 10^{11}$ cm$^{-2}$ and $1 \times 10^{14}$ cm$^{-2}$.

The first spacer layer 23 and the second spacer layer 27 are formed with at least one of undoped GaAs, undoped $Al_xGa_{1-x}As$ ($0<x \leq 1$), undoped $In_yAl_zGa_{1-y-z}P$ ($0<y$, $z \leq 1$) and un-doped $In_wGa_{1-w}As_vP_{1-v}$, ($0 \leq w$, $v \leq 1$), and the thickness thereof is about 0.5 to 30 nm. The channel layer 25 is formed with at least one of GaAs, $In_xGa_{1-x}As$ ($0<x \leq 0.5$), $Al_yGa_{1-y}As$ ($0<y \leq 0.3$), $In_wAl_zGa_{1-w-z}P$ ($0<w$, $z \leq 1$) and $In_wGa_{1-w}As_vP_{1-v}$ ($0 \leq w$, $v \leq 1$), and the thickness thereof is about 0.5 to 100 nm.

The Schottky layer 31 is formed with at least one of GaAs, $Al_xGa_{1-x}As$ ($0<x \leq 1$), $In_wAl_zGa_{1-w-z}P$ ($0<w$, $z \leq 1$) and $In_wGa_{1-w}As_vP_{1-v}$ ($0 \leq w$, $v \leq 1$), and the thickness thereof is about 1 to 300 nm. The Schottky layer 31 can be selectively doped, and the doped concentration is about $0~3 \times 10^{18}$ cm$^{-3}$. The etch top layer 33 is formed with at least one of $In_wAl_zGa_{1-w-z}P$ ($0<w$, $z \leq 1$), $Al_xGa_{1-x}As$ ($0<x \leq 1$), $In_wGa_{1-w}As_vP_{1-v}$ ($0 \leq w$, $v \leq 1$) and aluminum arsenide (AlAs), and the thickness thereof is about 0.5 to 100 nm. The Schottky layer 31 and the etch top layer 33 can be selectively doped with carbon concentration of $5 \times 10^{17}$ cm$^{-3}$ to $1 \times 10^{20}$ cm$^{-3}$ and/or with oxygen concentration of $1 \times 10^{18}$ cm$^{-3}$ to $1 \times 10^{20}$ cm$^{-3}$.

The pHEMT sub structure 20 further includes a buffer layer 35 disposed between the substrate 10 and the first donor layer 21. The buffer layer 35 is formed with at least one of un-doped GaAs, un-doped $Al_xGa_{1-x}As$ ($0<x \leq 1$), un-doped $In_yAl_zGa_{1-y-z}P$ ($0<y$, $z \leq 1$) and un-doped $In_wGa_{1-w}As_vP_{1-v}$, ($0 \leq w$, $v \leq 1$), and the thickness thereof is about 1 to 2000 nm.

Figure 2:
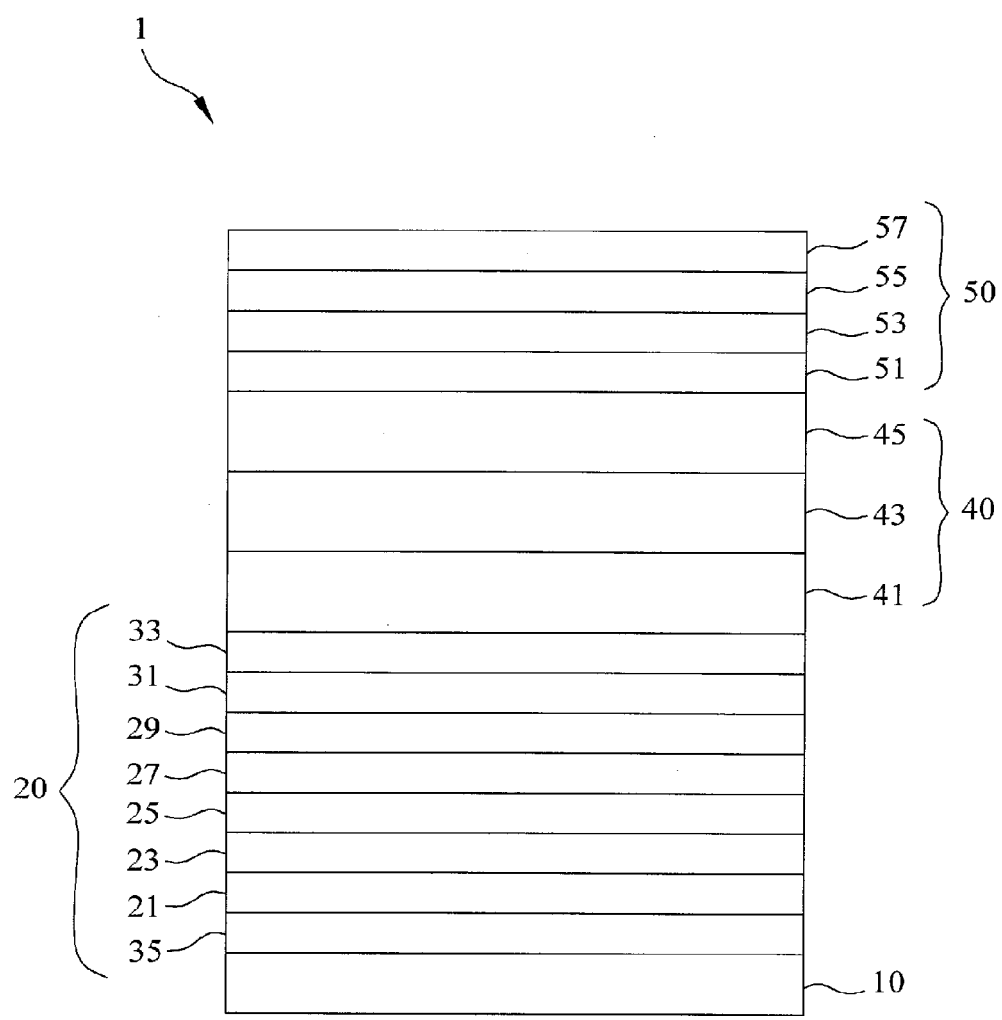
FIG. 2 schematically shows a structure of the BiHEMT according to another preferred embodiment of the present invention.

The sub-collector/separating layer 40 can be implemented by a single heavily doped N GaAs layer (N+ doped GaAs), as shown in FIG. 1. The dopant in the sub-collector/separating layer 40 can be at least one of silicon (Si), sulfur (S), tellurium (Te) and selenium (Se), the doping concentration is within $1 \times 10^{18}$ cm$^{-3}$ to $2 \times 10^{20}$ cm$^{-3}$, the thickness thereof is about 50 to 3000 nm. Alternatively, the sub-collector/ separating layer 40 can be implemented by a three-layer structure including a cap layer 41, a separating layer 43 and a sub collector layer 45, as shown in FIG. 2. The cap layer 41 and the sub-collector layer 45 are formed with N+ doped GaAs, and the dopant thereof can be at least one of Si, S, Te and Se. The doping concentration is within $1 \times 10^{18}$ cm$^{-3}$ to $2 \times 10^{20}$ cm$^{-3}$, and the thickness is about 5 to 3000 nm. The separating layer 43 can be formed with at least one of GaAs, un-doped $Al_xGa_{1-x}As$ ($0<x \leq 1$), $In_yAl_zGa_{1-y-z}P$ ($0<y$, $z \leq 1$), $In_wGa_{1-w}As_vP_{1-v}$ ($0 \leq w$, $v \leq 1$) and $In_uGa_{1-u}P$ ($0<u \leq 1$), and the thickness thereof is about 0.5 to 1000 nm. The carbon concentration in at least one of the cap layer 41, the separating layer 43 and the sub collector layer 45 is within $5 \times 10^{17}$ cm$^{-3}$ to $1 \times 10^{20}$ cm$^{-3}$, and/or the oxygen concentration is within $1 \times 10^{18}$ cm$^{-3}$ to $1 \times 10^{20}$ cm$^{-3}$.

Moreover, the separating layer 43 can further be implemented by a III-V multilayer structure, such as a multilayer structure with stacked GaAs, $Al_xGa_{1-x}As$ ($0<x \leq 1$), $In_yAl_zGa_{1-y-z}P$ ($0<y$, $z \leq 1$), $In_wGa_{1-w}As_vP_{1-v}$ ($0 \leq w$, $v \leq 1$) and $In_uGa_{1-u}P$ ($0<u \leq 1$). The carbon concentration in at least one layer is within $5 \times 10^{17}$ cm$^{-3}$ to $1 \times 10^{20}$ cm$^{-3}$, and/or the oxygen concentration is within $1 \times 10^{18}$ cm$^{-3}$ to $1 \times 10^{20}$ cm$^{-3}$.

Additionally, the cap layer 41 and the sub-collector layer 45 can be implemented by another stacked III-V multilayer structure, such as a multilayer structure with any stacked combination of N type GaAs, N type $Al_xGa_{1-x}As$ ($0<x \leq 1$), N type $In_yAl_zGa_{1-y-z}P$ ($0<y$, $z \leq 1$) and N type $In_wGa_{1-w}As_vP_{1-v}$ ($0 \leq w$, $v \leq 1$). The carbon concentration in at least one layer is within $5 \times 10^{17}$ cm$^{-3}$ to $1 \times 10^{20}$ cm$^{-3}$, and/or the oxygen concentration is within $1 \times 10^{18}$ cm$^{-3}$ to $1 \times 10^{20}$ cm$^{-3}$.

In case of the sub-collector/separating layer 40 implemented by the three layer structure, the cap layer 41 and the pHEMT sub structure 20 are combined to form a pHEMT, and the sub-collector layer 45 and the HBT sub structure 50 are combined to form an HBT such that the pHEMT and the HBT are joined together by the separating layer 43.

The HBT sub structure 50 includes a collector layer 51, a base layer 53, an emitter layer 55 and an ohmic contact layer 57, which are sequentially stacked from bottom to top. The collector layer 51 is formed with at least one of N type GaAs, N type $In_uGa_{1-u}P$ ($0<u \leq 1$), N type $Al_xGa_{1-x}As$ ($0<x \leq 0.5$) and N type $In_wGa_{1-w}As_vP_{1-v}$ ($0 \leq w$, $v \leq 1$), wherein the dopant can be at least one of Si, S, Te and Se, the doping concentration is within $1 \times 10^{15}$ cm$^{-3}$ to $5 \times 10^{17}$ cm$^{-3}$, and the thickness is within 50~5000 nm. The base layer 53 is formed with at least one of P type GaAs, P type $In_xGa_{1-x}As$ ($0<x \leq 0.3$), P type $GaAs_ySb_{1-y}$ ($0.7<y \leq 1$), P type $In_wGa_{1-w}As_zN_{1-z}$ ($0<w$, $z \leq 1$) and P type $GaP_xSb_{1-x-y}As_y$ ($0<x \leq 1$ and $0 \leq y \leq 0.1$), the dopant is carbon, the carbon concentration is within $1 \times 10^{19}$ cm$^{-3}$ to $3 \times 10^{20}$ cm$^{-3}$, and the thickness is within 5~500 nm.

The emitter layer 55 is formed with at least one of N type $In_uGa_{1-u}P$ ($0<u \leq 1$) (or N type $Al_xGa_{1-x}As$ ($0<x \leq 0.5$)), N type $In_yAl_zGa_{1-y-z}P$ ($0<y$, $z \leq 1$) and N type $In_wGa_{1-w}As_vP_{1-v}$, ($0 \leq w$, $v \leq 1$). The dopant can be at least one of Si, S, Te and Se, the doping concentration is within $5 \times 10^{16}$ cm$^{-3}$ to $2 \times 10^{18}$ cm$^{-3}$, and the thickness is within 10~200 nm. The ohmic contact layer 57 is formed with at least one of GaAs, $In_xGa_{1-x}As$ ($0<x \leq 1$) and $In_xGa_{1-x}As_ySb_{1-y}$ ($0<x, y \leq 1$). The ohmic contact layer 57 is selectively doped with at least one of Si, S, Te and Se, the doping concentration is within 0 to $1 \times 10^{20}$ cm$^{-3}$, and the thickness is within 10~300 nm.

One aspect of the present invention is that the carbon concentration in the sub-collector/separating layer is within $5 \times 10^{17}$ cm$^{-3}$ to $1 \times 10^{20}$ cm$^{-3}$ and/or the oxygen concentration is within $1 \times 10^{18}$ cm$^{-3}$ to $1 \times 10^{\circ}$ cm$^{3}$ through the setting of the process parameters. Furthermore, the present invention can be applied to the Schottky layer and the etch stop layer as a result that the lattice during the process of epitaxy growth is possibly stabilized. Meanwhile, it is sure to prevent the dopants, the elements, the vacancies or the defects from diffusing into the neighboring layers. Therefore, the problem of mobility degradation and resistance increase is successfully solved and the stability of the process is achieved.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A BiHEMT, comprising:
a substrate formed with gallium arsenide;
a pseudomorphic high electron mobility transistor (pHEMT) sub structure formed on the substrate;
a sub-collector/separating layer formed on the pHEMT sub structure, and having carbon concentration within $5 \times 10^{17}$ cm$^{-3}$ and $1 \times 10^{20}$ cm$^{-3}$ and/or oxygen concentration within $1 \times 10^{18}$ cm$^{-3}$ and $1 \times 10^{\circ}$ cm$^{-3}$; and a heterojunction bipolar transistor (HBT) sub structure formed on the sub-collector/separating layer, wherein the sub-collector/ separating layer and the pHEMT sub structure are combined to form a pHEMT, the sub-collector/separating layer and the HBT sub structure are combined to form an HBT, and the sub-collector/ separating layer is a single layer with a thickness of 10~3000 nm.

2. The BiHEMT as claimed in claim 1, wherein said sub-collector/separating layer is formed with a heavily doped N GaAs layer (N+ doped GaAs), a dopant of the sub-collector/separating layer is at least one of silicon (Si), sulfur (S), tellurium (Te) and selenium (Se), and a doping concentration thereof is within $1 \times 10^{18}$ cm$^{-3}$ to $2 \times 10^{\circ}$ cm$^{-3}$.

3. The BiHEMT as claimed in claim 1, wherein said pHEMT sub structure comprises a first donor layer, a first spacer layer, a channel layer, a second spacer layer, a second donor layer, a Schottky layer and an etch top layer, which are sequentially stacked from bottom to top; the first donor layer and the second donor layer are formed with at least one of silicon-doped gallium arsenide (Si-doped GaAs), silicon-doped aluminum gallium arsenide (Si-doped $Al_xGa_{1-x}As$, $0<x\leq1$), silicon-doped Indium aluminum gallium phosphide (Si-doped $In_yAl_zGa_{1-y-z}P$, $0<y$, $z\leq1$) and silicon-doped Indium gallium phosphide arsenide (Si-doped $In_w Ga_{1-w}As_vP_{1-v}$, $0\leq w,v\leq1$), a doping concentration of silicon in the first donor layer and the second donor layer is within $1 \times 10^{13}$ cm$^{-3}$ and $1 \times 10^{19}$ cm$^{-3}$, and a thickness thereof is about 0.5~100 nm; the first spacer layer and the second spacer layer are formed with at least one of undoped GaAs, undoped $Al_xGa_{1-x}As$ ($0<x\leq1$), undoped $In_yAl_zGa_{1-y-z}P$ ($0<y$, $z\leq1$) and un-doped $In_wGa_{1-w}A_{sv}P_{1-v}$ ($0\leq w$, $v\leq1$), a thickness thereof is about 0.5 to 30 nm; the channel layer is formed with at least one of GaAs, $In_xGa_{1-x}As$ ($0<x\leq1$), $Al_yGa_{1-y}As$ ($0<y\leq1$), $In_wAl_zGa_{1-w-z}P$ ($0<w$, $z\leq1$) and $In_wGa_{1-w}As_vP_{1-v}$ ($0\leq w$, $v\leq1$), and a thickness is about 0.5 to 30 nm; the Schottky layer is formed with at least one of GaAs, $Al_xGa_{1-x}As$ ($0<x\leq1$), $In_wAl_zGa_{1-w-z}P$ ($0<w$, $z\leq1$) and $In_wGa_{1-w}As_vP_{1-v}$ ($0\leq w$, $v\leq1$), and a thickness thereof is about 1 to 300 nm; and the etch top layer is formed with at least one of GaAs, $In_wAl_zGa_{1-w-z}P$ ($0<w,z\leq1$), $Al_xGa_{1-x}As$ ($0<x\leq1$), $In_wGa_{1-w}As_vP_{1-v}$ ($0\leq w$, $v\leq1$) and aluminum arsenide (AlAs), and a thickness thereof is about 0.5 to 100 nm.

4. The BiHEMT as claimed in claim 3, wherein the first donor layer and the second donor layer is delta doped by at least one of silicon-delta doped gallium arsenide (Si-delta doped GaAs), silicon-delta doped aluminum gallium arsenide (Si-delta doped $Al_xGa_{1-x}As$, $0<x\leq1$), silicon-delta doped Indium aluminum gallium phosphide (Si-delta doped $In_yAl_zGa_{1-y-z}P$, $0<y$, $z\leq1$) and silicon-delta doped Indium gallium phosphide arsenide (Si-delta doped $In_wGa_{1-w}As_vP_{1-v}$, $0\leq w$, $v\leq1$), and a doping concentration of silicon in the first donor layer and the second donor layer is within $1\times10^{11}$ cm$^{-2}$ and $1\times10^{14}$ cm$^{-2}$.

5. The BiHEMT as claimed in claim 3, wherein said pHEMT sub structure further comprises a buffer layer disposed between the substrate and the first donor layer, the buffer layer is formed with at least one of un-doped GaAs, un-doped $Al_xGa_{1-x}As$ ($0<x\leq1$), un-doped $In_yAl_zGa_{1-y-z}P$ ($0<y$, $z\leq1$) and un-doped $In_wGa_{1-w}As_vP_{1-v}$, ($0\leq w$, $v\leq1$), and a thickness thereof is about 1 to 2000 nm.

6. The BiHEMT as claimed in claim 3, wherein said Schottky layer has a carbon concentration within $5\times10^{17}$ cm$^{-3}$ to $1\times10^{20}$ cm$^{-3}$, and/or oxygen concentration within $1\times10^{15}$ cm$^{-3}$ to $1\times10^{20}$ cm$^{-3}$.

7. The BiHEMT as claimed in claim 3, wherein said etch stop layer has a carbon concentration within $5\times10^{17}$ cm$^{-3}$ to $1\times10^{20}$ cm$^{-3}$, and/or an oxygen concentration within $1\times10^{18}$ cm$^{-3}$ to $1\times10^{20}$ cm$^{-3}$.

8. The BiHEMT as claimed in claim 1, wherein said HBT sub structure comprises a collector layer, a base layer, an emitter layer and an ohmic contact layer, which are sequentially stacked from bottom to top; the collector layer is formed with at least one of N type GaAs, N type $In_uGa_{1-u}P$ ($0<u\leq1$), N type $Al_xGa_{1-x}As$ ($0<x\leq0.5$) and N type $In_wGa_{1-w}As_vP_{1-v}$ ($0\leq w$, $v\leq1$), a dopant in the collector layer is at least one of Si, S, Te and Se, a doping concentration in the collector layer is within $1\times10^{15}$ cm$^{-3}$ to $5\times10^{17}$ cm$^{-3}$, and a thickness thereof is within 50~5000 nm; the base layer is formed with at least one of P type GaAs, P type $In_xGa_{1-x}As$ ($0<x\leq0.3$), P type $GaAs_ySb_{1-y}$ ($0.7<y\leq1$), P type $In_wGa_{1-w}As_zN_{1-z}$ ($0<w$, $z\leq0.3$) and P type $GaP_xSb_{1-x-y}As_y$ ($0<x\leq1$ and $0\leq y\leq0.1$), a dopant in the base layer is carbon, a carbon concentration in the base layer is within $1\times10^{19}$ cm$^{-3}$ to $3\times10^{20}$ cm$^{-3}$, and a thickness thereof is within 5~500 nm; the emitter layer is formed with at least one of N type $In_uGa_{1-u}P$ ($0<u\leq1$)(or N type $Al_xGa_{1-x}As$ ($0<x\leq0.5$)), N type $In_yAl_zGa_{1-y-z}P$ ($0<y$, $z\leq1$) and N type $In_wGa_{1-w}As_vP_{1-v}$ ($0\leq w$, $v\leq1$), a dopant in the emitter layer can be at least one of Si, S, Te and Se, a doped concentration in the emitter layer is within $5\times10^{16}$ cm$^{-3}$ to $2\times10^{18}$ cm$^{-3}$, a thickness thereof is within 10~200 nm; and the ohmic contact layer is formed with at least one of GaAs, $In_xGa_{1-x}As$ ($0<x\leq1$) and $In_xGa_{1-x}As_ySb_{1-y}$ ($0<x$, $y\leq1$), and a thickness thereof is within 10~300 nm, and the ohmic contact layer is doped with at least one of Si, S, Te and Se, and a doping concentration within 0 to $1\times10^{20}$ cm$^{-3}$.

* * * * *